(12) United States Patent
Janzén et al.

(10) Patent No.: US 10,403,746 B2
(45) Date of Patent: Sep. 3, 2019

(54) HETEROSTRUCTURE AND METHOD OF ITS PRODUCTION

(71) Applicant: SWEGAN AB, Linköping (SE)

(72) Inventors: Erik Janzén, Linköping (SE); Jr-Tai Chen, Vikingstad (SE)

(73) Assignee: SWEGAN AB, Linkoping (SE)

( * ) Notice: Subject to any disclaimer, the term of this patent is extended or adjusted under 35 U.S.C. 154(b) by 0 days.

(21) Appl. No.: 15/562,346

(22) PCT Filed: Mar. 31, 2015

(86) PCT No.: PCT/EP2015/057038
§ 371 (c)(1),
(2) Date: Sep. 27, 2017

(87) PCT Pub. No.: WO2016/155794
PCT Pub. Date: Oct. 6, 2016

(65) Prior Publication Data
US 2018/0358457 A1 Dec. 13, 2018

(51) Int. Cl.
*H01L 29/778* (2006.01)
*H01L 21/02* (2006.01)
(Continued)

(52) U.S. Cl.
CPC ...... *H01L 29/7786* (2013.01); *H01L 21/0254* (2013.01); *H01L 21/0262* (2013.01);
(Continued)

(58) Field of Classification Search
None
See application file for complete search history.

(56) References Cited

U.S. PATENT DOCUMENTS

| | | |
|---|---|---|
| 2007/0141823 A1 | 6/2007 | Preble et al. |
| 2009/0189192 A1 | 7/2009 | Lieten et al. |
| 2015/0069407 A1 | 3/2015 | Matsubayashi et al. |

FOREIGN PATENT DOCUMENTS

| | | |
|---|---|---|
| JP | 2010287882 A | 12/2010 |
| JP | 2012051774 A | 3/2012 |

(Continued)

OTHER PUBLICATIONS

Nakajima, A., et al., "Step Control of Vicinal 6H-SiC(0001) Surface by H2 Etching", "Journal of Applied Physics", May 13, 2005, pp. 104919-1-104919-5, vol. 97.
(Continued)

*Primary Examiner* — Fernando L Toledo
*Assistant Examiner* — Valerie N Newton
(74) *Attorney, Agent, or Firm* — Hultquist, PLLC; Steven J. Hultquist

(57) ABSTRACT

The present document discloses an $Al_xGa_{1-x}N/GaN$ heterostructure, wherein x is $0.10<x<0.60$, preferably $0.13<x<0.40$, most preferably $0.15<x<0.25$. The heterostructure comprises an $Al_xGa_{1-x}N$ layer formed directly on a GaN layer. The heterostructure presents a room temperature 2DEG mobility of 1800 to 2300 $cm^2/Vs$, preferably 1900 to 2300 $cm^2/Vs$, most preferably 2000 to 2300 $cm^2/Vs$, and a pinch-off voltage which differs by 0.3 V or less, preferably by 0.25 V or less, most preferably by 0.20 V or less from a theoretical value of the pinch-off voltage, wherein the theoretical value of the pinch-off voltage is estimated based on an electrostatic band diagram obtained by XRD, of the $Al_xGa_{1-x}N/GaN$ heterostructure.

15 Claims, 6 Drawing Sheets

(51) Int. Cl.
H01L 29/20 (2006.01)
H01L 29/205 (2006.01)
H01L 29/06 (2006.01)

(52) U.S. Cl.
CPC .... *H01L 21/02458* (2013.01); *H01L 29/0684* (2013.01); *H01L 29/2003* (2013.01); *H01L 29/205* (2013.01)

(56) References Cited

FOREIGN PATENT DOCUMENTS

| | | |
|---|---|---|
| JP | 2012119429 A | 6/2012 |
| JP | 2012174705 A | 9/2012 |

OTHER PUBLICATIONS

Nakajima, A., et al., "Growth of High-Quality AlN With Low Pit Density on SiC Substrates", "Journal of Crystal Growth", Feb. 10, 2004, pp. 351-356, vol. 265.

Qu, S., et al., "Influence of the Growth Temperature of AlN Buffer on the Quality and Stress of GaN Films Grown on 6H-SiC Substrate by MOVPE", "Journal of Alloys and Compounds", May 14, 2010, pp. 417-422, vol. 502.

Soubatch, S., et al., "Structure and Morphology of 4H-SiC Wafter Surfaces After H2-Etching", "Materials Science Forum", May 15, 2005, pp. 761-764, vol. 483-485.

HETEROSTRUCTURE AND METHOD OF ITS PRODUCTION

CROSS-REFERENCE TO RELATED APPLICATION

This application is a U.S. national phase under the provisions of 35 U.S.C. § 371 of International Patent Application No. PCT/EP2015/057038 filed Mar. 31, 2015. The disclosure of such international patent application is hereby incorporated herein by reference in its entirety, for all purposes.

TECHNICAL FIELD

The present disclosure relates to an $Al_xGa_{1-x}N/GaN$ heterostructure for semiconductor devices and to a method for producing the same.

BACKGROUND $Al_xGa_{1-x}N/GaN$ heterostructures are of great interest for use in semiconductor devices such as, but not limited to, high electron mobility transistors, HEMTs (also known as heterostructure or heterojunction field effect transistors, HFETs) due to excellent high frequency and power handling capabilities.

The transport properties of $Al_xGa_{1-x}N/GaN$ heterostructures have been studied intensively over the last two decades. At high temperature regime (>100 K), which is of interest for most device applications, the mobility of the two-dimensional electron gas (2DEG) formed near the interface of the $Al_xGa_{1-x}N/GaN$ heterostructure has been theoretically calculated and has shown to be ultimately limited by phonon scattering (L. Hsu and W. Walukiewicz, Physical Review B 56, 1520 (1997), L. Hsu and W. Walukiewicz, Journal of Applied Physics 89, 1783 (2001)).

Nevertheless, in practice, other important scattering mechanisms related to structural imperfections of the materials, including alloy disordering and interface roughness, can actually dominate the 2DEG mobility.

Room temperature 2DEG mobilities of 1300 to 1600 $cm^2/Vs$ have been reported for $Al_xGa_{1-x}N/GaN$ heterostructures, depending on the 2DEG density and crystalline quality (N. Maeda et al, Optical Materials 23, 211, (2003), and V. M. Polyakov et al, Applied Physics Letters 97, 142112 (2010).

By insertion of a thin (~1-2 nm) aluminum nitride exclusion ($AlN_{ex}$) layer between the GaN and the $Al_xGa_{1-x}N$ layers, the 2DEG mobility can be increased to ~2200 $cm^2/Vs$ (R. S. Balmer et al, Phys. Stat. Sol. 7, 2331 (2003), X. Wang et al, Journal of Crystal Growth 298, 835 (2007) and U. Forsberg et al, Journal of Crystal Growth 311, 3007 (2009)). This improvement is associated with better 2DEG confinement and less alloy disorder near the $Al_xGa_{1-x}N/GaN$ interface, enabling less electron wave function penetration into the AlGaN barrier so that alloy disorder scattering is alleviated.

A drawback of insertion of an $AlN_{ex}$ exclusion layer is that it may, due to its wide band gap nature, increase the surface potential in a HEMT structure, resulting in that a low ohmic contact is difficult to obtain. The low ohmic contact is essential for high frequency applications. Additional recess etching into the $Al_xGa_{1-x}N$ barrier for contact metallization process becomes necessary to reduce the contact resistance below 0.5 Ωmm.

Hence, it is highly desirable to develop an $Al_xGa_{1-x}N/GaN$ heterostructure with high mobility, but without disadvantages of prior art $Al_xGa_{1-x}N/GaN$ heterostructures, and a method for producing the same.

Moreover, it is highly desirable to develop an $Al_xGa_{1-x}N/GaN$ heterostructure for semiconductor devices resulting in devices with higher operation frequencies as well as with less trapping and lagging effects.

Example of a prior art method is disclosed in US 2015/069407 A1.

SUMMARY

An object of the present disclosure is to provide an improved $Al_xGa_{1-x}N/GaN$ heterostructure, and in particular an $Al_xGa_{1-x}N/GaN$ heterostructure which is improved in terms of one or more of the above mentioned properties.

The invention is defined by the appended independent claims, with embodiments being set forth in the appended dependent claims, in the following description and in the drawings.

According to a first aspect, there is provided an $Al_xGa_{1-x}N/GaN$ heterostructure, wherein x is 0.10<x<0.60, preferably 0.13<x<0.40, most preferably 0.15<x<0.25, the heterostructure comprises an $Al_xGa_{1-x}N$ layer formed directly on a GaN layer. The heterostructure presents a room temperature 2DEG mobility of 1800 to 2300 $cm^2/Vs$, preferably 1900 to 2300 $cm^2/Vs$, most preferably 2000 to 2300 $cm^2/Vs$, and a pinch-off voltage which differs by 0.5 V or less, preferably by 0.4 V or less, 0.3 V or less, 0.25 V or less and most preferably by 0.20 V or less from a theoretical value of the pinch-off voltage, wherein the theoretical value of the pinch-off voltage is estimated based on an electrostatic band diagram obtained by XRD, of the $Al_xGa_{1-x}N/GaN$ heterostructure.

"Heterostructure" is herein defined as a structure comprising of two or more different semiconducting materials.

By "formed directly on" is meant that the heterostructure does not contain any other layer(s) that measurably affects the heterostructure.

By "2DEG mobility" is meant the mobility an electron gas free to move in two dimensions, but tightly confined in the third.

"Room temperature" may be defined as 16° C. to 27° C.

By "pinch-off voltage" is meant, at the material level of a field-effect transistor, the voltage at which the 2DEG in the heterostructure is completely depleted. At the device level of a field-effect transistor, it is meant the voltage at which the current flow between source and drain is blocked because the channel between these electrodes is completely depleted by the applied gate voltage.

By "electrostatic band diagram" is meant full depletion approximation by electrostatic analysis. This approximation is obtained by assuming that the 2DEG is fully depleted by the applied pinch-off voltage, Vp. This analysis is based on the electrostatic distribution of the charge and the electrical field in the depletion region, e.g. from the surface to the AlGaN/GaN interface.

An advantage by this heterostructure may be that a so-called exclusion layer is not needed between the GaN and the $Al_xGa_{1-x}N$ layers in order to improve the mobility of the heterostructure. Moreover, devices comprising this heterostucture may have higher operation frequencies as well as less trapping and lagging effects as compared to prior art heterostructures.

The theoretical value of the pinch-off voltage of the heterostructure may be estimated based on the thickness and the Al concentration of the $Al_xGa_{1-x}N$ layer as determined by XRD measurements.

The pinch-off voltage, Vp, may be calculated by the equation $$Vp = -\left\{\left[(P_{Total(GaN)} - P_{Total(AlGaN)}) \times \frac{q}{(\varepsilon_{(AlGaN)} - 1) \times \varepsilon_0}\right) \times t_{AlGaN}\right] - \emptyset_{B(Ni)}\right\}$$

wherein:

$$P_{Total(GaN)} = \frac{P_{sp(GaN)}}{q},$$

i.e. the total polarization density of GaN, wherein $P_{sp(GaN)} = -2.9 \times 10^{-6}$ C/cm², i.e. the spontaneous polarization of GaN, and $q = 1.6 \times 10^{-19}$ C, i.e. the electric charge constant. $P_{Total(AlGaN)}$ is the total polarization density of AlGaN wherein AlGaN is the barrier layer, i.e. the $Al_xGa_{1-x}N$ layer created upon the simultaneously flow of Al and Ga, and is determined by $$P_{Total(AlGaN)} = \frac{P_{sp(AlGaN)} + P_{ps(AlGaN)}}{q},$$

wherein $P_{sp(AlGaN)} = xP_{sp(AlN)} + (1-x)P_{sp(GaN)} - x(1-x)b$, i.e. the spontaneous polarization density of AlGaN, wherein x is the Al content in %, as determined by X-ray diffraction (XRD) measurements and $P_{sp(AlN)} = -8.1 \times 10^{-6}$ C/cm², i.e. the spontaneous polarization of AlN and $P_{sp(GaN)} = -2.9 \times 10^{-6}$ C/cm², i.e. the spontaneous polarization of GaN and $b = -2.1 \times 10^{-6}$ C/cm², i.e. the bowing parameter for AlGaN spontaneous polarization. $P_{sp(AlGaN)}$ is the piezoelectrical polarization of AlGaN and $\varepsilon_{(AlGaN)} \approx \varepsilon_{(GaN)} - x$, i.e. the dielectric constant of AlGaN of unit $\varepsilon_0$, wherein $\varepsilon_{(GaN)} = 10.0\varepsilon_0$, the dielectric constant of GaN, and $\varepsilon_0 = 8.884 \times 10^{-14}$ F/cm, i.e. the permittivity of vacuum, $t_{AlGaN}$ is the thickness in cm of AlGaN, and $\emptyset_B \approx (1.3x + 0.84) eV \approx 1.04$ eV, the Schottky barrier height.

A slope of an Al concentration versus a thickness of a transition zone of GaN and $Al_xGa_{1-x}N$ may be more than 20% per 1 nm, preferably more than 20% per 0.7 nm, most preferably more than 20% per 0.5 nm.

By "transition zone" is herein meant the zone (interface) between the $Al_xGa_{1-x}N$ and GaN layer.

A thickness of the GaN layer may be 1400 to 4000 nm, preferably 1400 to 3000 nm, most preferably 1400 to 2000 nm.

The GaN layer may have a purity of 98% to 100%.

A thickness of the $Al_xGa_{1-x}N$ layer may be 5 to 35 nm, preferably 10 to 30 nm, most preferably 15 to 25 nm.

The $Al_xGa_{1-x}N$/GaN heterostructure may present a 2DEG mobility that above 1800 cm²/V-s, preferably above 1850 or above 1900 cm²/V-s while a 2DEG density is from about 0.6E+13 to about 1.4E+13 cm⁻².

According to a second aspect there is provided a semiconductor device formed from the $Al_xGa_{1-x}N$/GaN heterostructure.

According to a third aspect there is provided a high electron mobility transistor (HEMT) formed from the $Al_xGa_{1-x}N$/GaN heterostructure.

According to a fourth aspect there is provided method of producing an $Al_xGa_{1-x}N$/GaN heterostructure comprising an $Al_xGa_{1-x}N$ layer formed directly on a GaN layer. The method comprises steps of providing a first Ga precursor flow of a first Ga flow rate, whereby the GaN layer is produced, substantially stopping the Ga precursor flow, providing a first Al precursor flow at a first Al flow rate, maintaining only the first Al precursor flow for a time sufficient to provide the heterostructure with a room temperature 2DEG mobility of 1800 to 2300 cm²/Vs, preferably 1900 to 2300 cm²/Vs, most preferably 2000 to 2300 cm²/Vs, and a pinch-off voltage which differs by 0.5 V or less, preferably by 0.4 V or less, 0.3 V or less, 0.25 V or less, most preferably by 0.20 V or less from a theoretical value of the pinch-off voltage, wherein the theoretical value of the pinch-off voltage is estimated based on an electrostatic band diagram obtained by XRD, of the $Al_xGa_{1-x}N$/GaN heterostructure, substantially stopping the first Al precursor flow, and providing a second Al precursor flow at a second Al flow rate and second Ga precursor flow at a second Ga flow rate, whereby the $Al_xGa_{1-x}N$ layer is formed.

By "substantially stopping" is herein meant that the provision of Ga flow is stopped by at least 95%, preferably by at least 99%, most preferably by at least 99.9%.

By "formed directly on" is meant that the heterostructure does not contain any other layer that measurably affects the heterostructure.

The advantage of the method is that an $Al_xGa_{1-x}N$/GaN heterostructure according to the first aspect may be provided.

The advantage of providing an Al precursor flow at a first flow rate may be that a so-called sharp Al-content transition zone or interface between GaN and $Al_xGa_{1-x}N$ are created, hence resulting in a heterostructure with an improved mobility.

The first Al precursor flow rate and the time during which this is maintained are selected with regard to each other and with regard to factors, such as size, of the reactor. That is, higher flow rate and/or longer time will be needed for a bigger reactor.

The method may comprise a further step of providing a nitrogen precursor flow, such as an $NH_3$ precursor flow. The nitrogen precursor flow may be at least partially maintained during the provision of at least one of the first Ga precursor flow, the first Al precursor flow, the second Ga precursor flow and the second Al precursor flow.

The term "partially maintained" means that the flow rate may be adjusted up or down. Typically, this nitrogen precursor flow may be maintained throughout all of the steps mentioned above. Ramping up or ramping down may be done e.g. in connection with transitions between steps.

The first Al precursor flow may be provided at a first Al flow rate and during a time such that an amount of Al is introduced which is insufficient to provide a complete monolayer of Al, preferably less than 80% of a monolayer of Al, less than 60% of a monolayer of Al, less than 40% of a monolayer of Al or less than 20% of a monolayer of Al.

By "insufficient to provide a complete monolayer" means that the amount of material introduced is insufficient to provide complete coverage of the underlying surface.

The theoretical value of the pinch-off voltage of the heterostructure may be estimated based on the thickness and the Al concentration of the $Al_xGa_{1-x}N$ layer as determined by XRD measurements.

The pinch-off voltage, Vp, may be calculated by the formula $$Vp = -\left\{\left[\left((P_{Total(GaN)} - P_{Total(AlGaN)})\right) \times \frac{q}{(\varepsilon_{(AlGaN)} - 1) \times \varepsilon_0}\right) \times t_{AlGaN}\right] - \emptyset_{B(Ni)}\right\}$$

wherein:

$$P_{Total(GaN)} = \frac{P_{sp(GaN)}}{q},$$

i.e. the total polarization density of GaN, wherein $P_{sp(GaN)} = -2.9 \times 10^{-6}$ C/cm$^2$, i.e. the spontaneous polarization of GaN, and q=$1.6 \times 10^{-19}$ C, i.e. the electric charge constant. $P_{Total(AlGaN)}$ is the total polarization density of AlGaN wherein AlGaN is the barrier layer, i.e. the Al$_x$Ga$_{1-x}$N layer created upon the simultaneously flow of Al and Ga, and is determined by $$P_{Total(AlGaN)} = \frac{P_{sp(AlGaN)} + P_{ps(AlGaN)}}{q},$$

wherein $P_{sp(AlGaN)} = xP_{sp(AlN)} + (1-x)P_{sp(GaN)} - x(1-x)b$, i.e. the spontaneous polarization density of AlGaN, wherein x is the Al content in %, as determined by X-ray diffraction (XRD) measurements and $P_{sp(AlN)} = -8.1 \times 10^{-6}$ C/cm$^2$, i.e. the spontaneous polarization of AlN and $P_{sp(GaN)} = -2.9 \times 10^{-6}$ C/cm$^2$, i.e. the spontaneous polarization of GaN and b=$-2.1 \times 10^{-6}$ C/cm$^2$, i.e. the bowing parameter for AlGaN spontaneous polarization. $P_{ps(AlGaN)}$ is the piezoelectrical polarization of AlGaN and $\varepsilon_{(AlGaN)} \approx \varepsilon_{(GaN)} - x$, i.e. the dielectric constant of AlGaN of unit $\varepsilon_0$, wherein $\varepsilon_{(GaN)} = 10.0 \varepsilon_0$, the dielectric constant of GaN, and $\varepsilon_0 = 8.884 \times 10^{-14}$ F/cm, i.e. the permittivity of vacuum, $t_{AlGaN}$ is the thickness in cm of AlGaN, and $\emptyset_B \approx (1.3x+0.84)eV \approx 1.04$ eV, the Schottky barrier height.

The method may comprise a step of waiting 0 to 5 min, preferably 0 to 3 min, most preferably 0 to 1 min, between the step of stopping the Ga precursor flow of the first flow rate and the step of providing an Al precursor flow of a first flow rate.

The purpose of waiting is to remove residual Ga from the reactor.

The steps of the method may be preformed such that a thickness of the GaN layer is 1400 to 4000 nm, preferably 1400 to 3000 nm, most preferably 1400 to 2000 nm.

The steps may be preformed such that a thickness of the Al$_x$Ga$_{1-x}$N layer is 5 to 35 nm, preferably 10 to 30 nm, most preferably 15 to 25 nm.

The Al$_x$Ga$_{1-x}$N/GaN heterostructure may be grown by Metal Organic Chemical Vapor Deposition (MOCVD).

The Ga precursor may be e.g. TMGa or TEGa.

The Al precursor may be e.g. TMAl or TEA.

Each of the Ga precursor and the Al precursor is provided by at least one carrier gas, such as Ar, H$_2$ or N$_2$.

A pressure in a MOCVD reactor upon growth of the heterostructure may be 10 to 1000 mbar, preferably 30 to 200 mbar, most preferably 50 to 100 mbar.

A temperature in the MOCVD reactor upon growth of the heterostructure may be 950 to 1150° C., preferably 1000 to 1100° C., most preferably 1020 to 1080° C.

A growth rate of GaN may be 200 nm/h to 4000 nm/h, preferably 400 nm/h to 2000 nm/h, most preferably 800 to 1500 nm/h.

A growth rate of Al$_x$Ga$_{1-x}$N is 200 to 2000 nm/h, preferably 300 to 1000 nm/h, most preferably 400 to 800 nm/h.

DETAILED DESCRIPTION

The concept disclosed herein will now be explained in more detail. Initially an Al$_x$Ga$_{1-x}$N/GaN heterostructure for semiconductor devices is discussed, thereafter a method for producing the Al$_x$Ga$_{1-x}$N/GaN heterostructure is described and finally characterization results of an Al$_x$Ga$_{1-x}$N/GaN heterostructure produced by this method are discussed.

Al$_x$Ga$_{1-x}$N/GaN Heterostructure

Figure 1A:
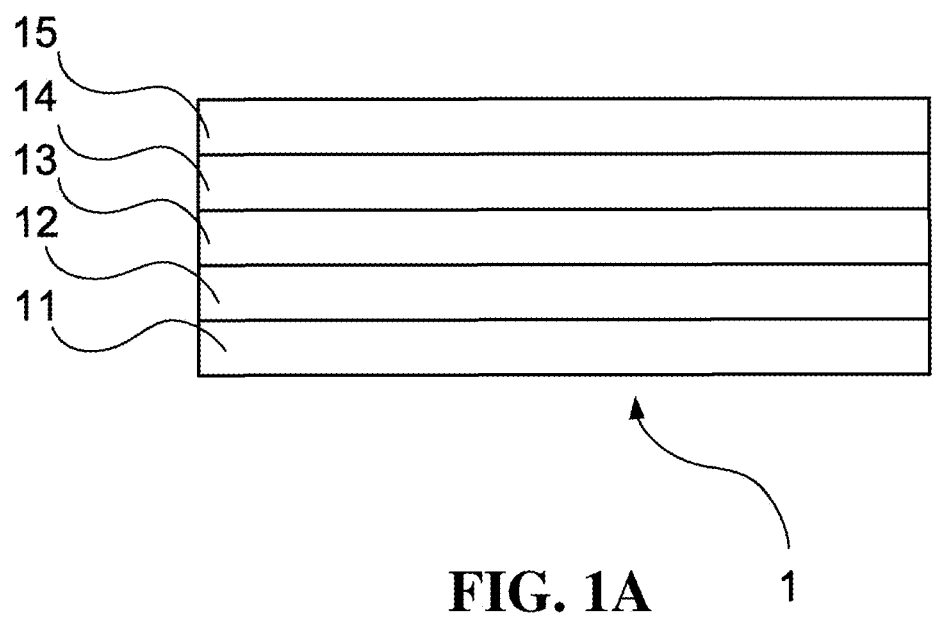
FIG. 1A schematically illustrates a HEMT structure comprising an Al$_x$Ga$_{1-x}$N/GaN heterostructure.

As mentioned above, Al$_x$Ga$_{1-x}$N/GaN heterostructures may be used in semiconductor devices, such as in high electron mobility transistor (HEMT) devices. FIG. 1A schematically illustrates an example of a HEMT device structure comprising, when viewed from bottom to top, an optional substrate 11, an aluminum nitride (AlN) nucleation layer 12, a gallium nitride (GaN), a buffer layer 13, an aluminum gallium nitride (Al$_x$Ga$_{1-x}$N) layer 14, and finally a GaN or a silicon nitride (SiN) passivation layer 15.

The gallium nitride layer 13 may comprise a buffer near the nucleation layer 12 layer and a spacer layer near the aluminum gallium nitride layer 14. Such layers may be provided by doping, as is known to the skilled person and thus need no further description here.

A SiC substrate may be used due to its high thermal conductivity properties in order to efficiently extract heat and to minimize temperature rise in the semiconductor device. The SiC polytype may be e.g. 4H or 6H. As an alternative a silicon, sapphire, N-polar GaN or Ga-polar GaN substrate may be used.

One purpose of the AlN nucleation layer is to compensate for the lattice mismatch between the substrate and the GaN buffer layer, and to obtain high quality epitaxial growth of the GaN buffer layer on the substrate. Another purpose of the nucleation layer is to enable growth of e.g. GaN on it. GaN does not nucleate two-dimensionally on some substrates, such as SiC, so there may be a need for an AlN nucleation layer to change the surface potential, such that GaN can be grown.

The purpose of the GaN buffer layer is to develop the structure quality by a thick layer growth and to exhibit a semi-insulating property. The GaN spacer layer prevents possible trapping effects and ionized impurity scattering that adversely affects 2DEG mobility.

The purpose of the AlGaN layer is to induce the 2DEG electron gas.

The purpose of the GaN or SiN passivation layer is to stabilize the surface conditions of the HEMT structure since the surface conditions influence the 2DEG density. By the use of a GaN or SiN passivation layer the 2DEG density may be increased or reduced, but the 2DEG mobility will not change much.

Figure 1B:
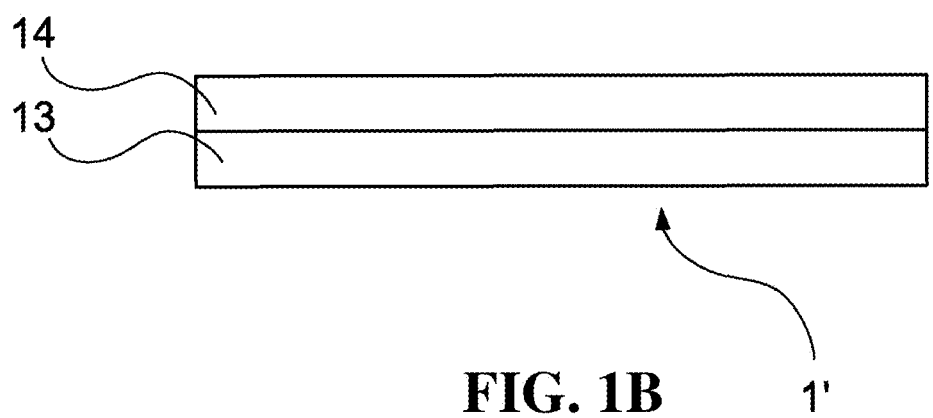
FIG. 1B schematically illustrates an Al$_x$Ga$_{1-x}$N/GaN heterostructure.

In FIG. 1B, the $Al_xGa_{1-x}N/GaN$ heterostructure is illustrated showing a GaN layer 13 and an $Al_xGa_{1-x}N$ layer 14.

The amount of impurities, such as oxygen, silicon and/or carbon, in the GaN layer may be low, typically of about less than $5·10^{16}$ cm$^{-3}$, i.e. close to the detection limit of Secondary Ion Mass Spectroscopy (SIMS).

The amount of impurities, such as oxygen, silicon and/or carbon, in the $Al_xGa_{1-x}N$ layer may be slightly higher as compared to the GaN layer, however this may not be critical since impurities in the $Al_xGa_{1-x}N$ layer may not affect the mobility of the $Al_xGa_{1-x}N/GaN$ heterostructure.

Method for Growth of an $Al_xGa_{1-x}N/GaN$ Heterostructure

The $Al_xGa_{1-x}N/GaN$ heterostructure may be deposited by Metal Organic Chemical Vapor Deposition (MOCVD), which also is known as Metal Organic Vapor Phase Epitaxy (MOVPE). MOCVD, or MOVPE, is a chemical vapor deposition method in which a solid material is deposited onto a substrate by chemical reactions of vapor phase precursors. The method is mainly used for growing complex semiconductor multilayer structures.

In MOCVD, the precursors are metal-organic compounds, typically in combination with a hydride gas such as $NH_3$. Precursors used for GaN growth may be TMGa, trimethylgallium, i.e. $Ga(CH_3)_3$ or TEGa, triethylgallium $Ga(C_2H_5)_3$, and ammonia, $NH_3$. Precursors used for $Al_xGa_{1-x}N$ growth may be e.g. TMGa or TEGa, $NH_3$ and TMAl, trimethylaluminum, $Al_2(CH_3)_6$ or triethylaluminium, TEA, $Al_2(C_2H_5)_6$.

The precursors are transported, often by means of a carrier gas, into a reactor chamber in which at least one substrate is placed. The flow rate of the carrier gas, e.g. $H_2$, flowing through a precursor (e.g. TMAl or TMGa) bubbler, may be 70 ml/min for AlN and 50 ml/min for GaN. The precursor flow merges with a main carrier gas flow, which may be on the order of 50 l/min for further transport to the reactor.

Reactions of the precursors forming reactive intermediates and by-products take place on or in near vicinity of the substrate(s). The reactants are adsorbed on the substrate, forming a thin film layer and finally by-products are transported away from the substrate, by means of pumping on the MOCVD system/reactor.

The pressure in a MOCVD system upon thin film growth normally ranges from a few mbars up to atmospheric pressure.

The reactor chamber may be of either cold-wall or hot-wall type. In a cold-wall reactor the substrate is typically heated from below while the reactor walls are kept cooler than the substrate. In contrast, in a hot-wall reactor the entire reactor chamber is heated, i.e. both the substrate and the reactor. For growth of the $Al_xGa_{1-x}N/GaN$ heterostructure discussed in this disclosure, a hot-wall VP508GFR, Aixtron reactor was used. The background pressure of the reactor is $\sim 1·10^{-4}$ mbar. (Refs: Doping of Al-content AlGaN grown by MOCVD, PhD thesis, D. Nilsson, 2014 and Wikipedia).

Growth of the $Al_xGa_{1-x}N/GaN$ Heterostructure

The steps for growth of an $Al_xGa_{1-x}N/GaN$ heterostructure by MOCVD will now be described in detail.

The sample, e.g. a part of a HEMT structure, onto which the $Al_xGa_{1-x}N/GaN$ heterostructure is to be grown, is inserted into the MOCVD reactor (for details about MOCVD, see above).

The temperature and the pressure in the MOCVD reactor may be constant during all production steps discussed below. As an example, the temperature may be 1070° C. and the pressure 50 mbar in the MOCVD reactor upon $Al_xGa_{1-x}N/GaN$ heterostructure growth.

During the production steps described below, one or both of the Ga and Al precursors may be transported to the reactor by at least one carrier gas, such as $H_2$, $N_2$ or Ar, as described above.

Further, the precursors may be provided at room temperature. As an alternative, at least one of the precursors may be heated in order to increase the vapor pressure and hence the growth rate of the different layers.

Moreover, in the steps discussed below, the flow of the precursors and/or the carrier gases may be controlled by at least one mass flow controller that may be situated between each of the precursor containers and the reactor.

The control of supplying the precursors to the MOCVD reactor may be performed by opening/closing at least one valve situated between the precursor containers and the MOCVD reactor. The opening/closing may be performed manually or by computer control.

To eliminate build-up of gas bursting into the reactor the precursor flows may be directed into a secondary line bypassing the main run line. This secondary line is called vent line. A pressure balance may be provided between the vent line and run line to avoid flow bursts when gas is switched into the main carrier flow.

During all process steps below a flow of $NH_3$ may be provided. The flow rate, e.g. 2 l/min, of $NH_3$ may be kept constant during all production steps.

The steps may be performed in the following order:

Firstly, a GaN layer may be grown. The precursors for production of this layer may be a Ga precursor, e.g. TMGa, and ammonia, $NH_3$. The purity of TMGa may be more than 5N, i.e. 99.999%. The selected flow rates and times of the $NH_3$ and Ga precursor is dependent on many different parameters, e.g. the reactor size, sample/substrate size, distance between the gas outlet of the precursor and the sample/substrate, the background pressure of the reactor etc. Hence, the flow rate and time of the flow may vary in different experimental set-ups.

The start of providing the Ga precursor and $NH_3$ may take place simultaneously. As an alternative, $NH_3$ may be provided before the start of providing the Ga precursor.

As an example, the Ga precursor, e.g. TMGa may be provided to the reactor at a first flow rate, of e.g. 3.2 ml/min. The flow rate of $NH_3$ may be 2 l/min as mentioned above.

Under those conditions, the growth rate of the GaN layer may be about 1200 nm/h and resulting in a GaN thickness of about 1.6 to 1.8 μm.

After a desired thickness of the GaN layer is reached, the GaN layer growth is stopped, by (substantially) stopping provision of the Ga precursor to the MOCVD reactor, i.e. by switching the flow of the Ga precursor into the vent line. The flow of $NH_3$ may be kept at the same flow rate as above, i.e. 2 l/min.

After (substantially) stopping provision of Ga, an optional step of waiting for about 0 to 5 min, normally 5 to 60 seconds, may be performed. The purpose of this step is to let residual gallium to flush away from the reactor by means of pumping on the MOCVD reactor/system. This step is optional, and as an alternative it is possible to move on to the next step without waiting.

The next step is to start the growth of the $Al_xGa_{1-x}N$ layer. Firstly, an Al precursor, e.g. TMAl, may be provided to the reactor at a first flow rate, a so-called pre-flow of Al.

This "pre-flow" of TMAl is provided in order to, facilitate a steep Al content transition from the GaN to the AlGaN in the transition zone but not complete, formation of an AlN layer on the GaN layer.

The purity of TMAl may be more than 5N, i.e. 99.999%.

The selected flow rates and flow times of the Al precursor is dependent on many different parameters, e.g. the reactor size, sample/substrate size, distance between the gas outlet of the precursor and the sample/substrate, the background pressure of the reactor etc. Hence, the flow rate and time of the flow may vary in different set-ups.

Preferably, the time and flow rate of the pre-flow may be selected such that less than one monolayer of AlN is formed, preferably less than 80% of a monolayer, less than 60% of a monolayer or less than 40% of a monolayer or less than 20% of a monolayer. The definition of "monolayer of AlN" is that the surface is covered by one layer of AlN. One monolayer of AlN has a thickness of about 0.50 nm.

Examples of different flow rates and flow times may be as set forth below.

When providing the AlN precursor to achieve a growth rate (depending on precursor flow and reactor properties) of 0.2-1.0 nm/min, preferably >0.5 nm/min, the total time may be less than 1 hour, preferably less than 30 min, less than 20 min, less than 10 min, less than 5 min, less than 3 min, less than 90 seconds, less than 60 seconds, less than 40 seconds or less than 30 seconds.

When providing the AlN precursor to achieve a growth rate (depending on precursor flow and reactor properties) of 0.2-1.0 nm/min, preferably 0.5-1.0 nm/min, the total time may be more than 5 seconds, preferably more than 10 seconds, more than 20 seconds or more than 30 seconds.

As an example, the first flow rate (the so-called pre-flow) of the Al precursor may be 0.2 ml/min and the flow rate of $NH_3$ may be the same as above, i.e. about 2 l/min.

Two different bubblers are used for the pre-flow and for the second flow of the Al precursor. The flow rate of the pre-flow is independent on the flow rate of the second flow. This may result in a growth rate of AlN of ~1 nm/min.

This step (i.e. pre-flow of Al) may be carried out for about 20 to 30 seconds. Hence, after maintaining the flow for 20 to 30 seconds, the provision of the Al precursor is stopped, e.g. by closing the valve to the Al precursor. This step of providing the Al precursor for 20 to 30 seconds is in this disclosure referred to as an "additional sharpening step".

Then both the Al precursor and the Ga precursor may be provided to the MOCVD reactor. The precursors may be provided simultaneously, e.g. by opening the valves to both precursors at the same time. The Al precursor may be provided at a second flow rate which may be the same or different as compared to the first Al flow rate (pre-flow) discussed above. As an example the flow rate of Al provided at this step may be the same as above, i.e. 0.2 ml/min. The Ga precursor may be provided at a second flow rate which may be different as compared to the first Ga precursor flow rate and as an example the second GaN flow rate may be 1.21 ml/min. The flow rate of the first flow is independent on the flow rate of the second flow.

Finally, when a desired thickness of the $Al_xGa_{1-x}N$ layer is reached, the provision of the Al precursor and the Ga precursor is stopped. Preferably this is performed simultaneously. The flow of $NH_3$ may be stopped as well, or it may be kept.

As an example, under those conditions, this may result in a growth rate of ~6 nm/min of $Al_xGa_{1-x}N$, wherein x~0.185, and a thickness of about 21 nm.

Characterization of $Al_xGa_{1-x}N$/GaN Heterostructures

Three different $Al_xGa_{1-x}N$/GaN (x~0.17) heterostructures, S1, S2 and S3, all having a thickness of ~28 nm were grown on 4H semi-insulating SiC substrates by a hot-wall MOCVD system. Details about the hot-wall MOCVD system and method are discussed above.

S1 is an $Al_xGa_{1-x}N$/GaN heterostructure without insertion of an exclusion layer, $AlN_{ex}$, and is grown according to a prior art method resulting in a diffuse interface.

S2 is an $Al_xGa_{1-x}N$/GaN heterostructure grown by the same method as S1 but with insertion of an exclusion layer, $AlN_{ex}$, (high-Al-content AlGaN), of ~2 nm between $Al_xGa_{1-x}N$ and GaN.

S3 is an $Al_xGa_{1-x}N$/GaN heterostructure grown according to the method described in this disclosure, i.e. with a so-called additional sharpening step of providing a pre-flow of the Al precursor for about 20-30 seconds before simultaneously providing the Al and Ga precursors resulting in the $Al_xGa_{1-x}N$ layer. This additional step results in a sharper interface as compared to the more diffuse interface of S1.

Figure 6:
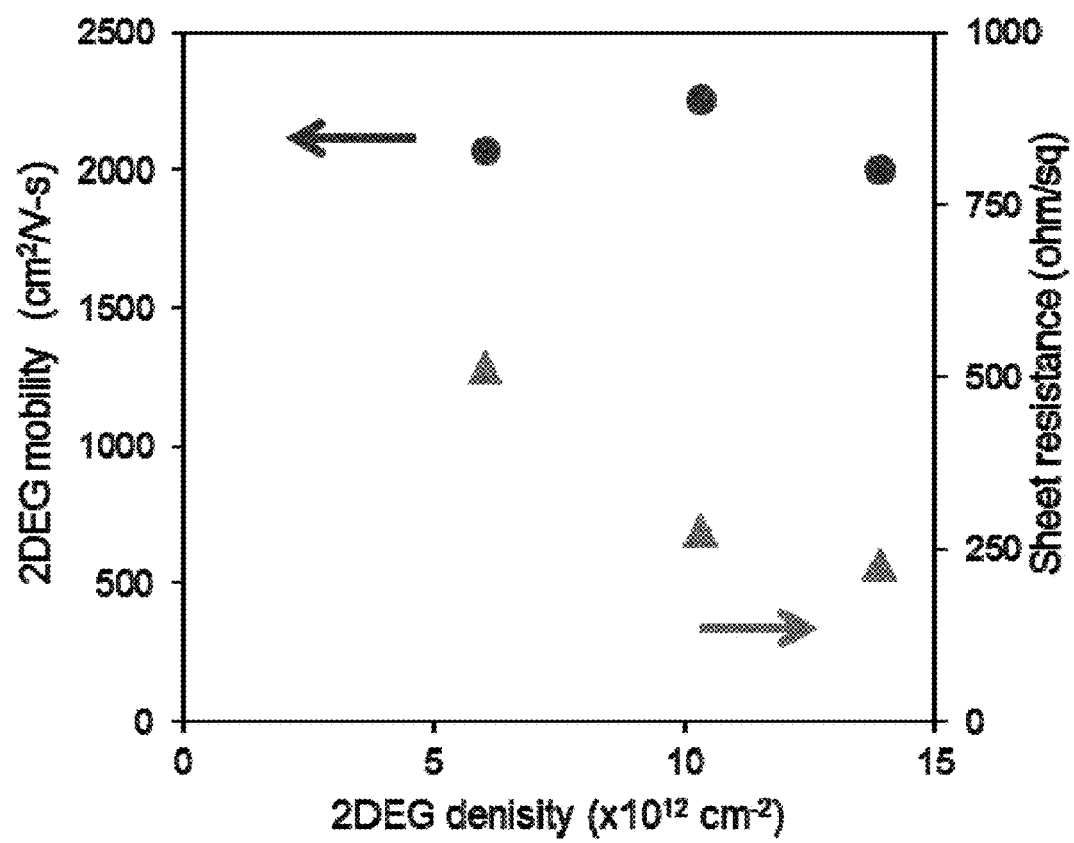
FIG. 6 shows the DEG mobility (dots) and sheet resistance (triangles) as functions of 2DEG density.

The 2DEG mobility is typically reduced with increased 2DEG density, especially when 2DEG density is increased above $0.6E+13$ cm$^{-2}$. See e.g. Maeda et al, Optical Materials 23, 211, (2003)). With the sharp interface, the room-temperature 2DEG mobility can remain well above 1900 cm$^2$/V-s in a wide range of 2DEG density from $0.6E+13$ to $1.4E+13$ cm$^{-2}$, as shown in FIG. 6.

Techniques for measuring properties of semiconductor materials, such as the pinch off voltage, are known from e.g Schroeder, D. K.: Semiconductor Material and Device Characterization, Third Edition, Wiley-Interscience, 2006.

The three samples S1-S3 were characterized by mercury-probe capacitance-voltage (CV) measurement to extract the 2DEG density and pinch-off voltage. Contactless eddy-current technique and Lehighton (LEI 1610) mobility system were performed to measure sheet resistance (Rs) and 2DEG mobility, respectively.

A summary of the electrical properties of the three different samples S1-S3 are shown in the table in Table 2 below.

TABLE 2

Electrical properties of the three samples S1, S2 and S3.

|  | S1 | S2 | S3 |
| --- | --- | --- | --- |
| Interface | No $AlN_{ex}$ | $AlN_{ex}$ | Sharpened |
| 2DEG mobility (cm$^2$/Vs) | 1669 | 2190 | 2154 |
| 2DEG density (cm$^{-2}$) | $6.34 \cdot 10^{12}$ | $7.8 \cdot 10^{12}$ | $6.5 \cdot 10^{12}$ |
| Sheet resistance, Rs (Ω/square) | 612 | 330 | 450 |
| Pinch-off voltage (V) | −3.0 | −4.2 | −3.1 |

By comparing the samples S1 and S2, it is clear to see that the 2DEG mobility is greatly increased, as expected, from 1669 to 2190 cm$^2$/Vs, by insertion of an $AlN_{ex}$, layer. However, the 2DEG density and pinch-off voltage have also increased, indicating that the thickness and the polarization strength contributed from the $AlN_{ex}$ layer are not negligible.

On the other hand, sample S3 produced according to the method disclosed herein exhibits almost identical electrical properties as the ones of sample S1, but with the exception that it exhibits a very high mobility, of 2154 cm$^2$/Vs. This mobility improvement leads to 36% reduction of Rs, from 612 Ω/square of S1 to 450 Ω/square of S3.

To rule out the possibility that the difference in mobility observed here may be associated with different levels of dislocation scattering as previously shown (L. S. Yu et al, Applied Physics Letters, 73, 238 (1998)), high-resolution x-ray diffraction rocking curve measurement was carried out. The crystalline quality of the three samples was confirmed similar. The full width of half maximum of rocking curve of (102) peak for all of the samples is around 200 arcsec.

By this comparison it is shown that the 2DEG mobility can be largely improved in an MOCVD-grown $Al_xGa_{1-x}N$/GaN heterostructure without insertion of an $AlN_{ex}$ layer.

Hence, the $Al_xGa_{1-x}N$/GaN heterostructure (sample S3) produced according to the method herein exhibits the same low pinch-off voltage, but lower sheet resistance as compared to the heterostructure produced according to the prior art method without an exclusion layer (sample S1).

Furthermore, high resolution scanning transmission electron microscopy (STEM) was performed to investigate the structural characteristics at the $Al_xGa_{1-x}N$/GaN interface of the three samples S1-S3.

Prior to the analysis, the samples were prepared by standard polishing and argon ion milling procedures.

Figure 2A:
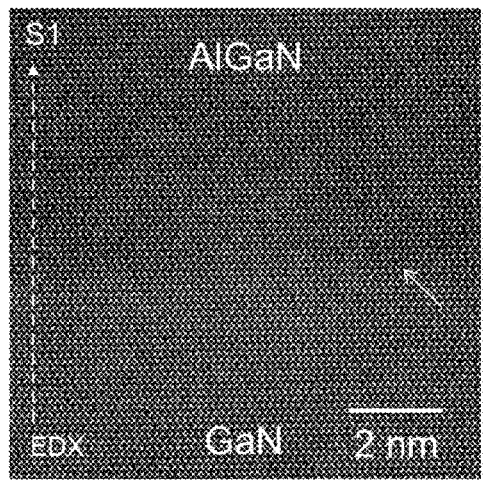
FIG. 2A shows a high resolution scanning transmission electron microscopy (STEM) picture of an Al$_x$Ga$_{1-x}$N/GaN heterostructure with a diffuse interface.
Figure 2B:
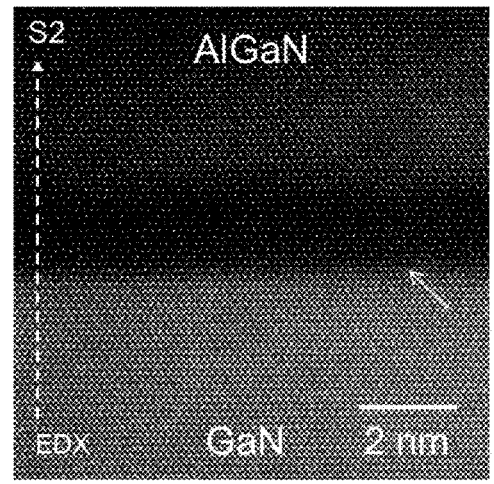
FIG. 2B shows a high resolution scanning transmission electron microscopy (STEM) picture of an Al$_x$Ga$_{1-x}$N/GaN heterostructure with an exclusion layer inserted between Al$_x$Ga$_{1-x}$N and Ga.
Figure 2C:
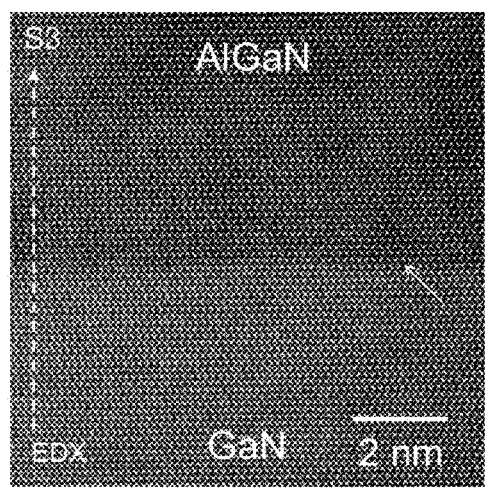
FIG. 2C shows a STEM picture of an Al$_x$Ga$_{1-x}$N/GaN heterostructure with a sharp interface.

FIGS. 2A-2C show the STEM images of samples S1, S2 and S3, respectively, with the dashed lines indicating the EDX probing direction and the arrows pointing out the interfaces.

In FIG. 2A a STEM picture of sample S1, i.e. the $Al_xGa_{1-x}N$/GaN heterostructure with a diffuse interface, grown without the extra step of providing a pre-flow of Al, is shown. FIG. 2B shows a STEM picture of sample S2, i.e. the heterostructure with insertion of an exclusion layer. In FIG. 2C a STEM picture of sample S3 grown with the additional sharpening step of providing a pre-flow of Al is shown.

As seen in FIG. 2A, the interface is obscure, suggesting that the elemental composition in this region has a diffuse characteristic. Moreover, the interface, i.e. the transition region between $Al_xGa_{1-x}N$ and GaN, of this sample, is thicker than the interface of sample S3 shown in FIGS. 2C.

Sample S2 with an $AlN_{ex}$ layer of ~2 nm shows a sharp $AlN_{ex}$/GaN interface in FIG. 2B which is similar or the same as the $AlN_{ex}$/GaN interface of sample S3 in FIG. 2C. Furthermore, by comparing FIG. 2A and FIG. 2C, sample S3 apparently shows a sharper $Al_xGa_{1-x}N$/GaN interface than that of S1.

The term "sharp", may be more readily visualized by presenting the transition rate of the EDX signal of aluminum from the GaN layer to the $Al_xGa_{1-x}N$ layer or the $AlN_{ex}$ layer.

Figure 3:
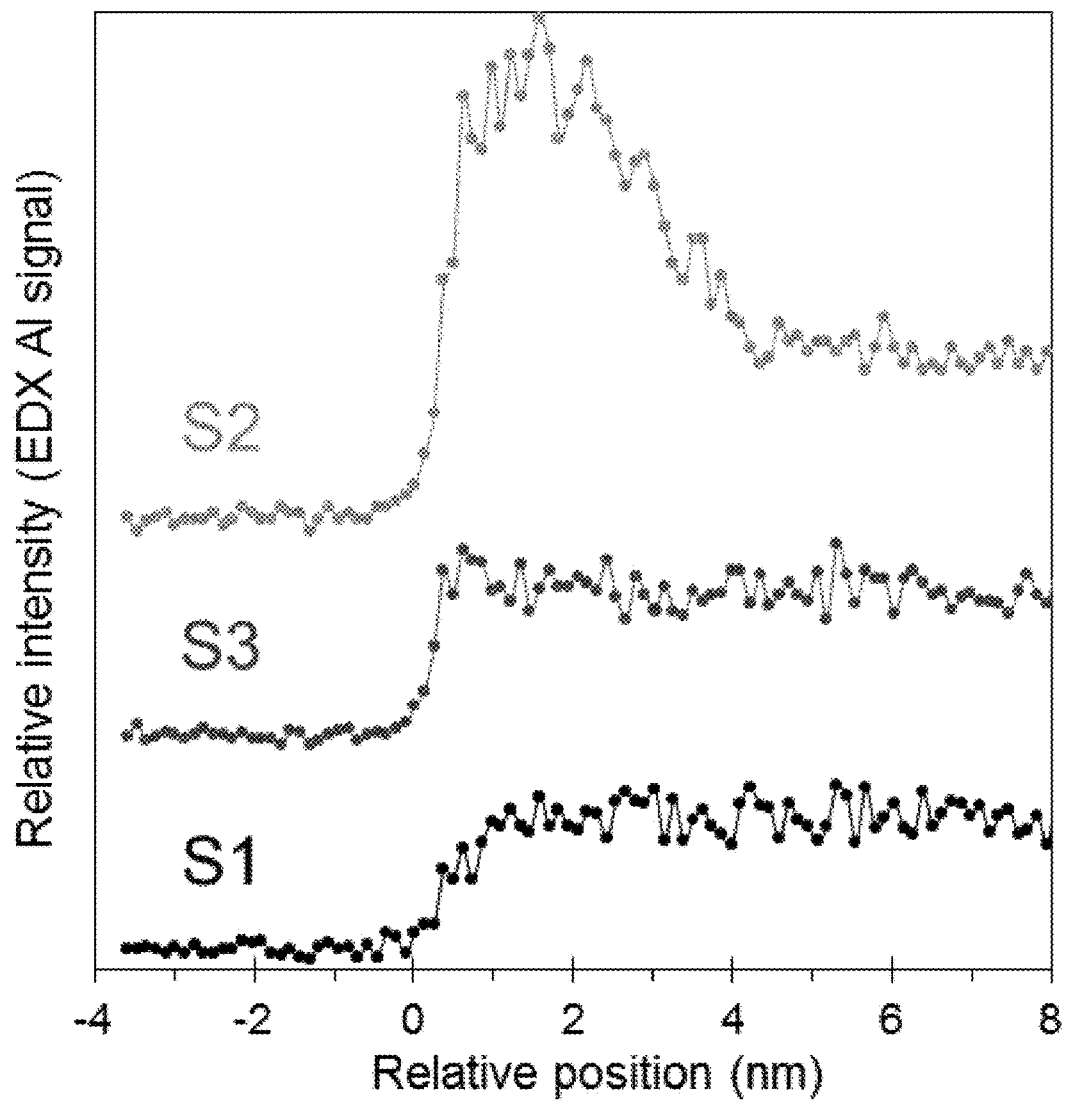
FIG. 3 shows a graph of the concentration of aluminum versus the thicknesses of the interfaces of the three different Al$_x$Ga$_{1-x}$N/GaN heterostructures in FIGS. 2A-2C.

The EDX lines (Al concentrations) versus the thicknesses of samples S1, S2 and S3 are shown in FIG. 3. The EDX spectra of the three samples were aligned to each other in the x direction for easier comparison. The spectra show the concentration of Al and how it increases upon formation of the heterostructure. When comparing the increase of Al concentration of sample S1 with the Al concentration of sample S3, it is seen that the slope in the transition zone between GaN and $Al_xGa_{1-x}N$ (i.e. when the Al content starts to increase) of S3 is steep, hence indicating a sharper interface. Moreover, the slope of sample S1 is not as smooth as the one of sample S3, indicating a slow Al incorporation resulting in a diffuse, non-uniform Al growth. This non-uniform Al incorporation may affect the mobility of the $Al_xGa_{1-x}N$ layer negatively.

The Al transition from the GaN to the AlGaN in S1 is ~1.5 nm in order to gradually reach the set Al content of the AlGaN layer, while the transition in S3 is more smooth and abrupt of less than 5 Å. Thus, it is believed that the mobility difference as seen between the samples S1 and S3 is associated with the abruptness of the Al transition. This suggestion is supported by the fact that the high-mobility sample S3 also exhibits an abrupt Al transition at the $Al_xGa_{1-x}N$/GaN interface.

As is seen in FIG. 3, also sample S2 shows a rather steep and smooth slope, indicating that it has a high mobility. However, in S2 a thin high Al-content $Al_xGa_{1-x}N$ layer was created. In contrast, sample S3 has a steep and smooth slope without creation of a high Al-content AlGaN layer between $Al_xGa_{1-x}N$ and GaN.

Interface Control in AlGaN-Based HEMT Structures

Another set of samples were prepared and are discussed below. $Al_xGa_{1-x}N$/GaN, x~0.19, as determined by XRD, heterostructures were grown at 1070° C. and 50 mbar using the same growth time and precursor flow rates. The thickness of the $Al_xGa_{1-x}N$ layers was determined to ~21 nm.

The pre-flow of TMAl together with $NH_3$ were introduced into the MOCVD reactor after the GaN growth and the time of the Al pre-flow was varied from 0 to 75 seconds. The AlN growth rate at these growth conditions (estimated from the thickness of the AlN nucleation layer) was roughly estimated to ~0.03 nm/s.

No significant effect on the electrical properties was observed using growth interruption (herein defined as an optional waiting step) in order to flush away residual Ga precursor after the GaN growth.

The first four samples in Table 3 below were grown according to prior art without the Al pre-flow step, i.e. with 0 seconds of Al pre-flow.

For the next four samples shown in the table, a pre-flow of Al of different flow times was introduced.

As seen in Table 3, the mobility saturates at about ~2200 cm$^2$/Vs for a TMAl flow time of ≥30 seconds and at a TMAl flow time of 30 seconds a pinch-off voltage of −2.1 V and mobility of 2200 cm$^2$/Vs was achieved.

TABLE 3

Electrical properties, growth interruption times and TMAl flow times of different samples.

|  | Growth interruption time (s) | TMAl flow time (s) | R (Ω/sq) | 2DEG density n (cm$^{-2}$) | Mobility (cm$^2$/Vs) | Pinch-off voltage (V) |
| --- | --- | --- | --- | --- | --- | --- |
| SL1 | 0 | 0 | 526 | 6.90 · 10$^{12}$ | 1747 | −1.75 |
| SL2 | 0 | 0 | 522 | 7.40 · 10$^{12}$ | 1627 | −1.80 |
| SL3 | 60 | 0 | 523 | 6.30 · 10$^{12}$ | 1657 | −1.80 |
| SL4 | 300 | 0 | 540 | 7.20 · 10$^{12}$ | 1632 | −1.85 |
| SL5 | 0 | 15 | 412 | 7.39 · 10$^{12}$ | 2050 | −2.00 |
| SL6 | 0 | 20 | 406 | 7.47 · 10$^{12}$ | 2140 | −2.10 |
| SL7 | 0 | 30 | 368 | 7.60 · 10$^{12}$ | 2221 | −2.10 |
| SL8 | 0 | 75 | 337 | 8.40 · 10$^{12}$ | 2263 | −3.00 |

When providing the Al pre-flow for longer times, ≥30 seconds, the pinch-off voltage increases significantly, indicating a too high Al concentration, i.e. that a layer of AlN starts to be formed.

Figure 4:
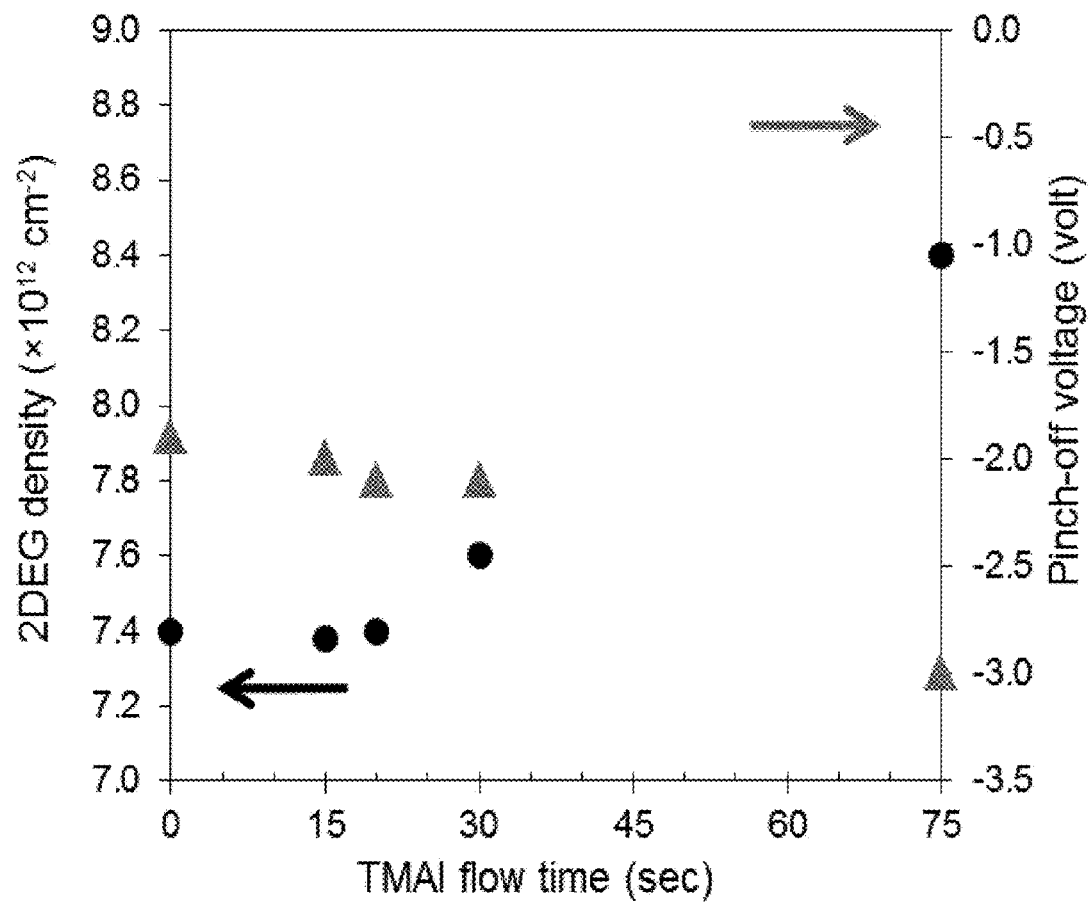
FIG. 4 shows the mobility and pinch-off voltage as a function of the TMAl flow time of Al$_x$Ga$_{1-x}$N/GaN heterostructures.
Figure 5:
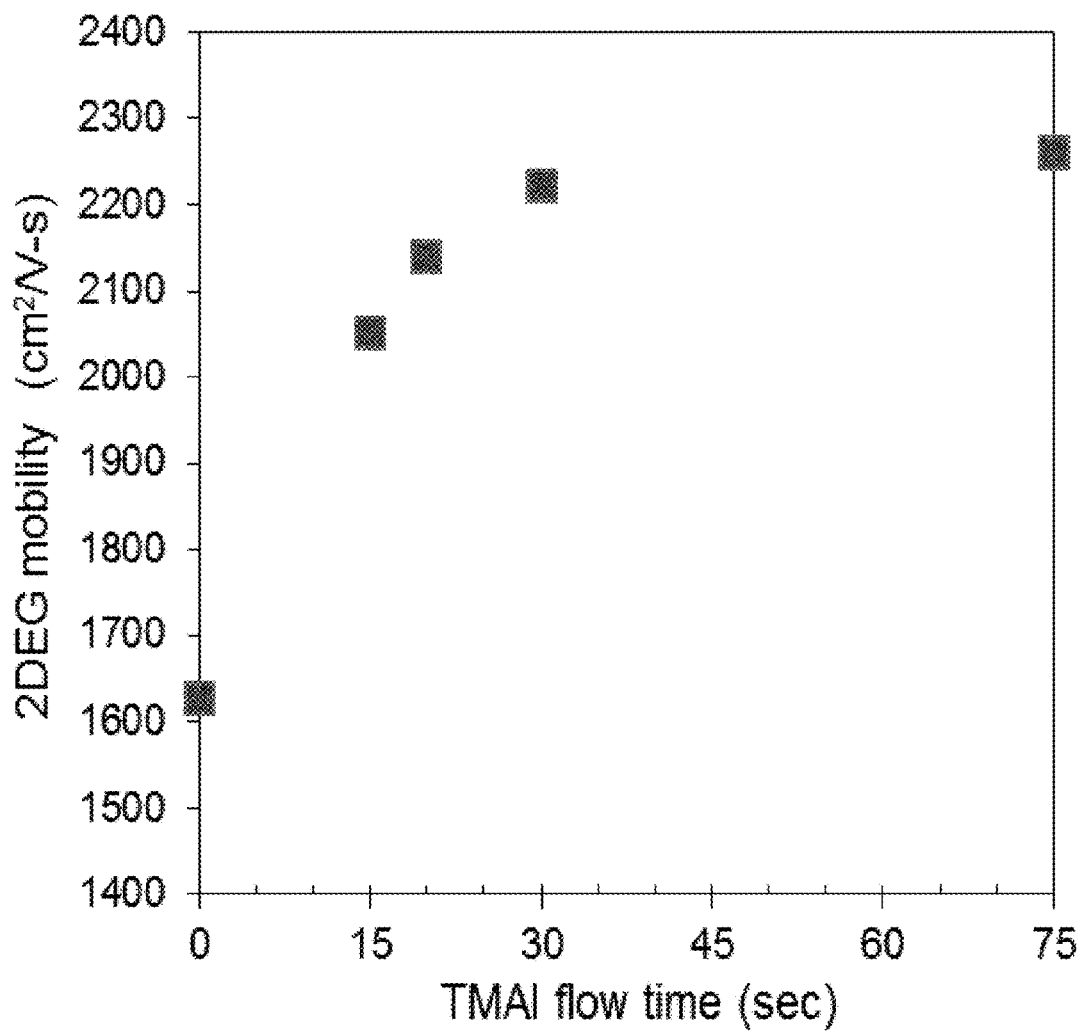
FIG. 5 shows the 2DEG mobility as a function of TMAl flow time of Al$_x$Ga$_{1-x}$N/GaN heterostructures.

The results of samples SL2, SL5, SL6, SL7 and SL8 shown in Table 3 are also shown in FIG. 4 and FIG. 5. FIG. 4 shows the density and pinch-off voltage as a function of the TMAl flow time of $Al_xGa_{1-x}N/GaN$ heterostructures and FIG. 5 shows the 2DEG mobility as a function of TMAl flow time of $Al_xGa_{1-x}N/GaN$ heterostructures.

Theoretical Calculation of Pinch-Off Voltage

A theoretical value of the pinch-off voltage of an $Al_xGa_{1-x}N/GaN$ heterostructure may be estimated based on the thickness and the Al concentration of the $Al_xGa_{1-x}N$ layer as determined from an electrostatic band diagram obtained by X-ray diffraction, XRD.

$$Vp/(\text{the thickness of AlGaN}) = -e*Ns/\epsilon_0\epsilon_r$$

The theoretical value of the pinch-off voltage may then be calculated by the following equation:

$$Vp = -\left\{\left[(P_{Total(GaN)} - P_{Total(AlGaN)}) \times \frac{q}{(\epsilon_{(AlGaN)} - 1) \times \epsilon_0}\right) \times t_{AlGaN}\right] - \emptyset_{B(Ni)}\right\} \quad (1)$$

wherein:

$$P_{Total(GaN)} = \frac{P_{sp(GaN)}}{q} \quad (2)$$

i.e. the total polarization density of GaN, wherein $P_{sp(GaN)} = -2.9 \times 10^{-6}$ C/cm², i.e. the spontaneous polarization of GaN (F. Bernardini et al, Phys. Rev. B 56 (R10 024-R10027)), and $q=1.6 \times 10^{-19}$ C, i.e. the electric charge constant.

$P_{Total(AlGaN)}$ is the total polarization density of AlGaN wherein AlGaN is the barrier layer, i.e. the $Al_xGa_{1-x}N$ layer created upon the simultaneously flow of Al and Ga, and is determined by $$P_{Total(AlGaN)} = \frac{P_{sp(AlGaN)} + P_{ps(AlGaN)}}{q} \quad (3)$$

wherein $$P_{sp(AlGaN)} = xP_{sp(AlN)} + (1-x)P_{sp(GaN)} - x(1-x)b \quad (4)$$

i.e. the spontaneous polarization density of AlGaN, wherein x is the Al content in %, as determined by X-ray diffraction (XRD) measurements and $P_{sp(AlN)} = -8.1 \times 10^{-6}$ C/cm², i.e. the spontaneous polarization of AlN and $P_{sp(GaN)} = -29 \times 10^{-6}$ C/cm², i.e. the spontaneous polarization of GaN and $b = -2.1 \times 10^{-6}$ C/cm², i.e. the bowing parameter for AlGaN spontaneous polarization (F. Bernardini et al, Phys. Rev. B 56 (R10 024-R10027))

$P_{ps(AlGaN)}$ is the piezoelectrical polarization of AlGaN.

$$\epsilon_{(AlGaN)} \approx \epsilon_{(GaN)} - x \quad (5)$$

i.e. the dielectric constant of AlGaN of unit $\epsilon_0$, wherein $\epsilon_{(GaN)} = 10.0\epsilon_0$, the dielectric constant of GaN (O. Ambacher, R. Dimitrov, W. Rieger et al, J. Appl. Phys. 85 (1999), 3222-3233, and $\epsilon_0 = 8.884 \times 10^{-14}$ F/cm, i.e. the permittivity of vacuum, $t_{AlGaN}$ is the thickness in cm of AlGaN, and $\emptyset_B \approx (1.3x+0.84)eV \approx 1.04$ eV, the Ni Schottky barrier height (see L. S. Yu et al, Applied Physics Letters, 73, 238 (1998)).

Equation 1 may be derived from:

$$V_p = -\{\Delta E_{c(AlGaN-GaN)} + \Delta E_{c(AlGaN2-GaN)} - \emptyset_{B(Hg)}\},$$
wherein $\Delta E_{c(AlGaN2-GaN)} = 0$ if not having a mobility enhancement layer, i.e. the layer created upon the pre-flow of Al, having a thickness T2, wherein 1 nm ≤ T2 ≤ 3 nm.

$$V_p = -\{\Delta E_{c(AlGaN-GaN)} + 0 - \emptyset_{B(Hg)}\}$$

$$= -\{\Delta E_{c(AlGaN-GaN)} - \emptyset_{B(Hg)}\}$$

$$= -\{(E_{field(AlGaN)} \times t_{AlGaN}) - \emptyset_{B(Hg)}\}$$

$$= -\left\{\left[(P_{Total(GaN)} - P_{Total(AlGaN)}) \times \frac{q}{(\epsilon_{(AlGaN)} - 1) \times \epsilon_0}\right) \times t_{AlGaN}\right] - \emptyset_{B(Ni)}\right\}$$

wherein $\Delta E_{c(AlGaN-GaN)}$ and $\Delta E_{c(AlGaN2-GaN)}$ are the conduction band offset between the AlGaN barrier layer and mobility enhancement layer, respectively, and GaN, $E_{field(AlGaN)}$ is the built-in electrostatic field.

Experimental/Characterization Details

The $Al_xGa_{1-x}N/GaN$ heterostructures were characterized by mercury-probe capacitance-voltage (CV) measurements to extract 2DEG density and pinch-off voltage. Contactless eddy-current technique and Lehighton (LEI 1610) mobility system were used to measure sheet resistance and 2DEG mobility, respectively.

The thickness of the GaN layers was measured by a white-light interferometry technique. The resolution of the measurements was 10 nm. The thickness of the $Al_xGa_{1-x}N$ layers was extracted from X-ray Diffraction (XRD) measurements (for details see below) and a simulation fitting.

For the XRD characterization a high-resolution X-ray diffractometer (Philips X'Pert MRD) with λ=0.15406 nm of Cu $K_{\alpha1}$ radiation was employed to characterize the structure of the HEMT samples or wafers. The HR-XRD system is equipped with a hybrid mirror and a triple-axis crystal as the primary and secondary optics, respectively, in which a resolution of ~0.003° (~11 arcsec) can be achieved. The thickness and the composition of the AlGaN barrier can be extracted from the measured 2θ/ω spectrum of the sample or the wafer using software, Epitaxy, to do the fitting of the measured 2θ/ω spectrum.

The Al concentration measurements were obtained from XRD measurements and the concentration of Al was estimated based in the XRD spectra of the layers. The concentration of Al was determined by fitting the AlGaN peak position in the measured 2θ/ω spectrum using the software Epitaxy.

The thickness of the AlGaN was determined by fitting the intervals of the fringes from the AlGaN peak in the 2θ/ω spectrum using the software, Epitaxy.

High resolution scanning transmission electron microscopy (STEM) measurements was performed in an image and probe Cs aberration corrected FEI Titan³ 60-300 S/TEM equipped with a monochromated high brightness Schottky field emission gun (XFEG) operating at 300 kV. Energy dispersive x-ray (EDX) measurements were performed with a Super-X EDX spectrometer and scanning TEM (STEM) images were acquired with a high angle annular dark field (HAADF) detector.

The invention claimed is:

1. An $Al_xGa_{1-x}N/GaN$ heterostructure, wherein x is 0.10<x<0.60, preferably 0.13<x<0.40, most preferably 0.15<x<0.25, characterized in that
said heterostructure comprises an $Al_xGa_{1-x}N$ layer formed directly on a GaN layer,
a thickness of the GaN layer is 1400 to 4000 nm,
a thickness of the $Al_xGa_{1-x}N$ layer is 5 to 35 nm,
the heterostructure presents a room temperature 2DEG mobility of 1800 to 2300 cm²/Vs, and
a pinch-off voltage which differs by 0.5 V or less from a theoretical value of the pinch-off voltage, wherein the theoretical value of the pinch-off voltage is estimated based on an electrostatic band diagram, which means full depletion approximation by electrostatic analysis, obtained by X-ray Diffraction, XRD, of the $Al_xGa_{1-x}N$/GaN heterostructure.

2. The $Al_xGa_{1-x}N$/GaN heterostructure according to claim 1, wherein the theoretical value of the pinch-off voltage of the heterostructure is estimated based on the thickness and the Al concentration of the $Al_xGa_{1-x}N$ layer as determined by XRD measurements.

3. The $Al_xGa_{1-x}N$/GaN heterostructure according to claim 1, wherein the theoretical pinch-off voltage, Vp, is calculated by the equation $$Vp = -\left\{\left[(P_{Total(GaN)} - P_{Total(AlGaN)}) \times \frac{q}{(\varepsilon_{(AlGaN)} - 1) \times \varepsilon_0}\right) \times t_{AlGaN}\right] - \emptyset_{B(Ni)}\right\},$$

wherein $$P_{Total(GaN)} = \frac{P_{sp(GaN)}}{q}$$

is the total polarization density of GaN, $P_{sp(GaN)} = -2.9 \times 10^{-6}$ C/cm² is the spontaneous polarization of GaN, and $q = 1.6 \times 10^{-19}$ C, is the electric charge constant,
$P_{Total(AlGaN)}$ is the total polarization density of AlGaN wherein AlGaN is the barrier layer, the $Al_xGa_{1-x}N$ layer created by simultaneous flow of Al and Ga, and is determined by $$P_{Total(AlGaN)} = \frac{P_{sp(AlGaN)} + P_{ps(AlGaN)}}{q}$$

wherein $$P_{sp(AlGaN)} = xP_{sp(AlN)} + (1-x)P_{sp(GaN)} - x(1-x)b$$

is the spontaneous polarization density of AlGaN, wherein x is the Al content in %, as determined by XRD measurements and $P_{sp(AlN)} = -8.1 \times 10^{-6}$ C/cm² is the spontaneous polarization of AlN and $P_{sp(GaN)} = -2.9 \times 10^{-6}$ C/cm² is the spontaneous polarization of GaN and $b = -2.1 \times 10^{-6}$ C/cm² is the bowing parameter for AlGaN spontaneous polarization,
$P_{pz(AlGaN)}$ is the piezoelectrical polarization of AlGaN,
$\varepsilon_{(AlGaN)} \approx \varepsilon_{(GaN)} - x$
is the dielectric constant of AlGaN of unit $\varepsilon_0$, wherein $\varepsilon_{(GaN)} = 10.0\varepsilon_0$, the dielectric constant of GaN, and $\varepsilon_0 = 8.884 \times 10^{-14}$ F/cm, is the permittivity of vacuum, $t_{AlGaN}$ an is the thickness in cm of $Al_xGa_{1-x}N$, and $\emptyset_B \approx (1.3x+0.84)eV \approx 1.04$ eV is the Ni Schottky barrier height.

4. The $Al_xGa_{1-x}N$/GaN heterostructure according to claim 1, wherein a slope of an Al concentration versus a thickness of a transition zone of GaN and $Al_xGa_{1-x}N$ is more than 20% per 1 nm.

5. The $Al_xGa_{1-x}N$/GaN heterostructure according to claim 1, wherein a 2DEG mobility is above 1800 cm²/V-s while a 2DEG density is from about 0.6E+13 to about 1.4E+13 cm⁻².

6. A semiconductor device comprising the $Al_xGa_{1-x}N$/GaN heterostructure according to claim 1.

7. A high electron mobility transistor (HEMT) comprising the $Al_xGa_{1-x}N$/GaN heterostructure according to claim 1.

8. A method of producing a $Al_xGa_{1-x}N$/GaN heterostructure comprising an $Al_xGa_{1-x}N$ layer formed directly on a GaN layer, the method comprising the following steps:
providing a first Ga precursor flow of a first Ga flow rate, whereby the GaN layer is produced,
substantially stopping the first Ga precursor flow,
providing a first Al precursor flow at a first Al flow rate,
maintaining only the first Al precursor flow at the first Al flow rate and during a time such that an amount of Al is introduced which is insufficient to provide a complete monolayer of Al, for a time sufficient to provide the heterostructure with:
a room temperature 2DEG mobility of 1800 to 2300 cm²/Vs, and
a pinch-off voltage which differs by 0.5 V or less from a theoretical value of the pinch-off voltage, wherein the theoretical value of the pinch-off voltage is estimated based on an electrostatic band diagram, which means full depletion approximation by electrostatic analysis, obtained by XRD, of the $Al_xGa_{1-x}N$/GaN heterostructure,
substantially stopping the first Al precursor flow, and
providing a second Al precursor flow at a second Al flow rate and second Ga precursor flow at a second Ga flow rate, whereby the $Al_xGa_{1-x}N$ layer is formed, wherein the steps are preformed such that
a thickness of the GaN layer is 1400 to 4000 nm, and
a thickness of the $Al_xGa_{1-x}N$ layer (14) is 5 to 35 nm.

9. The method according to claim 8, comprising a further step of providing a nitrogen precursor flow, wherein the nitrogen precursor flow is maintained during the provision of at least one of the first Ga precursor flow, the first Al precursor flow, the second Ga precursor flow, and the second Al precursor flow.

10. The method according to claim 8, wherein the theoretical value of the pinch-off voltage of the heterostructure is estimated based on the thickness and the Al concentration of the $Al_xGa_{1-x}N$ layer as determined by XRD measurements.

11. The method according to claim 8, wherein the theoretical pinch-off voltage, Vp, is calculated by the formula $$Vp = -\left\{\left[(P_{Total(GaN)} - P_{Total(AlGaN)}) \times \frac{q}{(\varepsilon_{(AlGaN)} - 1) \times \varepsilon_0}\right) \times t_{AlGaN}\right] - \emptyset_{B(Ni)}\right\},$$

wherein $$P_{Total(GaN)} = \frac{P_{sp(GaN)}}{q}$$

is the total polarization density of GaN, $P_{sp(GaN)} = -2.9 \times 10^{-6}$ C/cm² is the spontaneous polarization of GaN, and $q = 1.6 \times 10^{-19}$ C is the electric charge constant,
$P_{Total(AlGaN1)}$ is the total polarization density of AlGaN wherein AlGaN is the barrier layer, the $Al_xGa_{1-x}N$ layer created by simultaneous flow of Al and Ga, and is determined by $$P_{Total(AlGaN)} = \frac{P_{sp(AlGaN)} + P_{ps(AlGaN)}}{q}$$

wherein $$P_{sp(AlGaN)} = xP_{sp(AlN)} + (1-x)P_{sp(GaN)} - x(1-x)b$$

is the spontaneous polarization density of AlGaN, wherein x is the Al content in %, as determined by XRD measurements and $P_{sp(AlN)} = -8.1 \times 10^{-6}$ C/cm² is the spontaneous polarization of AlN and $P_{sp(GaN)} = -2.9 \times 10^{-6}$ C/cm² is the spontaneous polarization of GaN and $b = -2.1 \times 10^{-6}$ C/cm² is the bowing parameter for AlGaN spontaneous polarization, $P_{pz(AlGaN)}$ is the piezoelectrical polarization of AlGaN, $\in_{(AlGaN)} \approx \in_{(GaN)} - x$ is the dielectric constant of AlGaN of unit $\in_0$, wherein $\in_{(GaN)} = 10.0 \in_0$ is the dielectric constant of GaN, and $\in_0 = 8.884 \times 10^{-14}$ F/cm is the permittivity of vacuum, $t_{AlGaN}$ is the thickness in cm of $Al_xGa_{1-x}N$, and $\emptyset_B \approx (1.3x + 0.84)$eV $\approx 1.04$ eV is the Ni Schottky barrier height.

12. The method according to claim 8, comprising a step of waiting 0 to 5 min between the step of stopping the Ga precursor flow of the first flow rate and the step of providing the first Al precursor flow of a first flow rate.

13. The method according to claim 8, wherein the $Al_xGa_{1-x}N$/GaN heterostructure is grown by Metal Organic Chemical Vapor Deposition, MOCVD.

14. The method according to claim 8, wherein a pressure in a MOCVD reactor upon growth of the heterostructure is 10 to 1000 mbar.

15. The method according to claim 8, wherein a temperature in the MOCVD reactor upon growth of the heterostructure is 950 to 1150° C.

* * * * *

UNITED STATES PATENT AND TRADEMARK OFFICE
CERTIFICATE OF CORRECTION

PATENT NO. : 10,403,746 B2
APPLICATION NO. : 15/562346
DATED : September 3, 2019
INVENTOR(S) : Erik Janzen et al.

Page 1 of 1

It is certified that error appears in the above-identified patent and that said Letters Patent is hereby corrected as shown below:

On the Title Page

On Page 2, item (56) under the heading "OTHER PUBLICATIONS", in the listing of the second reference Qu, S. et al., the date "May 14, 2010" should be -- May 4, 2010 --.

Signed and Sealed this
Eighth Day of October, 2019

Andrei Iancu
*Director of the United States Patent and Trademark Office*